United States Patent
Munakata et al.

(10) Patent No.: US 12,476,219 B2
(45) Date of Patent: Nov. 18, 2025

(54) WIRE BONDING STATE DETERMINATION METHOD AND DEVICE USING A PRESCRIBED ELECTRIC WAVEFORM

(71) Applicant: Yamaha Robotics Co., Ltd., Tokyo (JP)

(72) Inventors: Hiroshi Munakata, Tokyo (JP); Shota Nakano, Tokyo (JP); Takuya Adachi, Tokyo (JP); Choyekh Mahdi, Tokyo (JP); Landaez Ysmaldo, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 756 days.

(21) Appl. No.: 17/609,774

(22) PCT Filed: Aug. 4, 2020

(86) PCT No.: PCT/JP2020/029772
§ 371 (c)(1),
(2) Date: Nov. 8, 2021

(87) PCT Pub. No.: WO2022/029870
PCT Pub. Date: Feb. 10, 2022

(65) Prior Publication Data
US 2022/0320040 A1    Oct. 6, 2022

(51) Int. Cl.
*H01L 23/00*    (2006.01)
*B23K 20/00*    (2006.01)
(Continued)

(52) U.S. Cl.
CPC ............ *H01L 24/85* (2013.01); *B23K 20/004* (2013.01); *B23K 20/26* (2013.01);
(Continued)

(58) Field of Classification Search
CPC .. B23K 20/004; B23K 20/007; B23K 20/005; B23K 20/26; B23K 2101/40;
(Continued)

(56) References Cited

U.S. PATENT DOCUMENTS 4,586,642 A * 5/1986 Dreibelbis .............. H01L 24/85
228/104
5,058,797 A * 10/1991 Terakado ............. B23K 20/007
228/180.5

(Continued)

FOREIGN PATENT DOCUMENTS

JP    H08236587    9/1996
JP    H0964116     3/1997
(Continued)

OTHER PUBLICATIONS

"Office Action of China Counterpart Application", issued on Apr. 24, 2024, with partial English translation thereof, pp. 1-13.
(Continued)

*Primary Examiner* — Keith Walker
*Assistant Examiner* — Carlos J Gamino
(74) *Attorney, Agent, or Firm* — JCIPRNET

(57) ABSTRACT

Provided is a wire bonding state determination device which determines a bonding state between a pad and a wire after the wire is bonded to the pad. The wire bonding state determination device includes: a waveform detector which makes an incident wave incident to the wire, and detects a transmission waveform of the wire and a reflection waveform from a first bonding surface between the pad and the wire; and a bonding determination unit which determines the bonding state between the pad and the wire based on the transmission waveform and the reflection waveform detected by the waveform detector.

6 Claims, 14 Drawing Sheets

(51) Int. Cl.
*B23K 20/26* (2006.01)
*G01R 31/28* (2006.01)
*G01R 31/52* (2020.01)
*B23K 101/40* (2006.01)

(52) U.S. Cl.
CPC ......... *G01R 31/2851* (2013.01); *G01R 31/52* (2020.01); *H01L 24/78* (2013.01); *B23K 2101/40* (2018.08); *H01L 24/48* (2013.01); *H01L 2224/48147* (2013.01); *H01L 2224/48465* (2013.01); *H01L 2224/78268* (2013.01); *H01L 2224/78301* (2013.01); *H01L 2224/78901* (2013.01); *H01L 2224/85045* (2013.01); *H01L 2224/85181* (2013.01); *H01L 2224/85186* (2013.01); *H01L 2224/859* (2013.01)

(58) Field of Classification Search
CPC ..... G01R 31/2851; G01R 31/52; H01L 21/50; H01L 2224/04042; H01L 2224/45144; H01L 2224/48091; H01L 2224/48147; H01L 2224/48227; H01L 2224/48465; H01L 2224/48471; H01L 2224/78; H01L 2224/78251; H01L 2224/78268; H01L 2224/78301; H01L 2224/78621; H01L 2224/78631; H01L 2224/78801; H01L 2224/78901; H01L 2224/85045; H01L 2224/85181; H01L 2224/85186; H01L 2224/859; H01L 24/05; H01L 24/45; H01L 24/48; H01L 24/78; H01L 24/85; H01L 2924/00014
See application file for complete search history.

(56) References Cited

U.S. PATENT DOCUMENTS

| | | | | |
|---|---|---|---|---|
| 6,085,962 | A * | 7/2000 | Jacobson | H01L 24/85 |
| | | | | 228/103 |
| 6,853,202 | B1 * | 2/2005 | Chang | G01R 31/2853 |
| | | | | 438/15 |
| 7,857,190 | B2 * | 12/2010 | Takahashi | H01L 24/85 |
| | | | | 228/103 |
| 9,793,179 | B2 * | 10/2017 | Middendorf | H01L 24/85 |
| 11,581,285 | B2 * | 2/2023 | Gillotti | H01L 24/78 |
| 2002/0130158 | A1 * | 9/2002 | Boller | H01L 21/67288 |
| | | | | 228/103 |
| 2006/0208037 | A1 * | 9/2006 | Siepe | H01L 24/78 |
| | | | | 228/8 |
| 2012/0011934 | A1 | 1/2012 | Matsui et al. | |
| 2015/0246411 | A1 * | 9/2015 | Sekine | H01L 24/78 |
| | | | | 228/9 |
| 2016/0351537 | A1 * | 12/2016 | Sekine | H01L 24/85 |
| 2019/0287941 | A1 * | 9/2019 | Maruya | H01L 22/12 |

FOREIGN PATENT DOCUMENTS

| | | | | |
|---|---|---|---|---|
| JP | 2005332850 | | 12/2005 | |
| JP | 2005332850 A | * | 12/2005 | ............ H01L 24/78 |
| JP | 2017005228 | | 1/2017 | |
| JP | 2024061283 A | * | 5/2024 | |
| WO | 2010113250 | | 10/2010 | |

OTHER PUBLICATIONS

Office Action of Taiwan Counterpart Application, with partial English translation thereof, issued on Aug. 17, 2022, pp. 1-12.
"International Search Report (Form PCT/ISA/210) of PCT/JP2020/029772," mailed on Oct. 13, 2020, pp. 1-3.

* cited by examiner

WIRE BONDING STATE DETERMINATION METHOD AND DEVICE USING A PRESCRIBED ELECTRIC WAVEFORM

CROSS-REFERENCE TO RELATED APPLICATION

This application is a 371 application of the International PCT application serial no. PCT/JP2020/029772, filed on Aug. 4, 2020. The entirety of the above-mentioned patent application is hereby incorporated by reference herein and made a part of this specification.

TECHNICAL FIELD

The present invention relates to a method for determining a wire bonding state and a device for determining a wire bonding state, which determine a bonding state between an electrode and a wire after the wire is bonded to the electrode.

RELATED ART

In a wire bonding apparatus used in an assembly step of electronic components, for example, a wire such as a thin gold wire or the like is bonded to an electrode of a semiconductor chip. The bonded wire is extended and is bonded in an electrode of a circuit substrate or the like, and connection between the electrode of the semiconductor chip and the electrode of the circuit substrate is performed. When the bonding between the electrodes goes wrong, a so-called connection defect occurs. In order to detect the connection defect that cannot be recognized by visual observation, it is proposed that an appropriate current is incident from the wire to the semiconductor chip, a value of the flowing current is measured, and the connection defect is electrically determined.

For example, Patent literature 1 discloses that a high-frequency signal is applied via a wire, and non-bonding detection of bonding is performed by an output level corresponding to a current flowing through the wire. In addition, Patent literature 2 discloses that a square wave is applied to a wire, and non-bonding detection of the wire is performed by an output level which is obtained by integrating a differential output of a current flowing in through the wire.

LITERATURE OF RELATED ART

Patent Literature

Patent literature 1: Japanese Patent Laid-Open No. 9-64116
Patent literature 2: Japanese Patent Laid-Open No. 8-236587

SUMMARY

Problems to be Solved

Incidentally, in recent years, more accurate non-bonding detection is required. However, in the conventional technologies described in Patent literatures 1 and 2, the detection precision may become defect due to a noise included in the signal.

Thus, the present invention aims to precisely detect a bonding state between an electrode and a wire.

Means to Solve Problems

A wire bonding state determination method of the present invention, in which a bonding state between an electrode and a wire is determined after the wire is bonded to the electrode, includes: a waveform detection step in which a prescribed electric waveform is incident to the wire, and a transmission waveform of the wire and a reflection waveform from a bonding surface between the electrode and the wire are detected; and a bonding determination step in which the bonding state between the electrode and the wire is determined by comparing the transmission waveform and the reflection waveform detected by the waveform detection step.

Accordingly, the bonding state between the electrode and the wire can be precisely detected.

In the wire bonding state determination method of the present invention, in the bonding determination step, a bonding area of the bonding surface may be determined by comparing the transmission waveform and the reflection waveform detected by the waveform detection step.

Accordingly, not only defect bonding but also the quality of the bonding area can be determined.

In the wire bonding state determination method of the present invention, in the bonding determination step, it may be determined that the bonding area of the bonding surface is smaller than a prescribed area when the magnitude of the reflection waveform detected by the waveform detection step is greater than the magnitude of the transmission waveform, and it may be determined that the bonding area of the bonding surface is equal to or larger than the prescribed area when the magnitude of the reflection waveform is equal to or smaller than the magnitude of the transmission waveform.

Accordingly, it is possible to determine whether or not the bonding area is larger than a cross-sectional area of the wire by an easy method.

The wire bonding state determination method of the present invention may include a reference waveform detection step in which the prescribed electric waveform is incident to the wire in a good bonding state with the electrode, and a transmission waveform of the wire and a reflection waveform from the bonding surface are detected as a reference waveform. In the bonding determination step, defect bonding may be determined when the magnitude of the reflection waveform detected by the waveform detection step is greater than the magnitude of the transmission waveform, and good bonding may be determined when the magnitude of the reflection waveform detected by the waveform detection step is equal to or smaller than the magnitude of the transmission waveform.

Accordingly, it is possible to detect whether or not the bonding area between the electrode and the wire is larger than a reference area by an easy method.

In the wire bonding state determination method of the present invention, the bonding of the wire to the electrode may be performed by ball bonding in which a free air ball formed at a front end of the wire is crimped and bonded to the electrode to form a crimp ball, and the bonding surface may be taken as a first bonding surface between the crimp ball and the electrode.

Accordingly, it is possible to detect the bonding area of the first bonding surface between the crimp ball and the electrode, and determine the bonding state.

In the wire bonding state determination method of the present invention, the bonding of the wire to the electrode may include: the ball bonding in which the free air ball formed at the front end of the wire is crimped and bonded to the electrode; and stitch bonding in which a side surface of the wire is crimped and bonded to another electrode after the ball bonding; and the bonding surface may be taken as a second bonding surface which is formed between the side surface of the wire and the another electrode by the stitch bonding.

Accordingly, it is possible to detect the bonding state of a stitch bonding location when the stitch bonding is performed after the ball bonding.

A wire bonding state determination device of the present invention, which determines a bonding state between an electrode and a wire after the wire is bonded to the electrode, includes: a waveform detector which makes a prescribed electric waveform incident to the wire, and detects a transmission waveform of the wire and a reflection waveform from a bonding surface between the electrode and the wire; and a bonding determination unit which determines the bonding state between the electrode and the wire by comparing the transmission waveform and the reflection waveform detected by the waveform detector.

In the wire bonding state determination device of the present invention, the bonding determination unit may determine a bonding area of the bonding surface by comparing the transmission waveform and the reflection waveform detected by the waveform detector.

In the wire bonding state determination device of the present invention, the bonding determination unit may determine that the bonding area of the bonding surface is smaller than a prescribed area when the magnitude of the reflection waveform detected by the waveform detector is greater than the magnitude of the transmission waveform, and may determine that the bonding area of the bonding surface is equal to or larger than the prescribed area when the magnitude of the reflection waveform is equal to or smaller than the magnitude of the transmission waveform.

In the wire bonding state determination device of the present invention, the bonding determination unit may include a reference waveform database which stores, as a reference waveform, a transmission waveform of the wire and a reflection waveform from the bonding surface when the prescribed electric waveform is incident from the waveform detector to the wire in a good bonding state with the electrode. With reference to the reference waveform database, defect bonding may be determined when the magnitude of the reflection waveform detected by the waveform detector is greater than the magnitude of the transmission waveform, and good bonding may be determined when the magnitude of the reflection waveform detected by the waveform detector is equal to or smaller than the magnitude of the transmission waveform.

Effect

The present invention can precisely detect the bonding state between the electrode and the wire.

DESCRIPTION OF THE EMBODIMENTS

Figure 1:
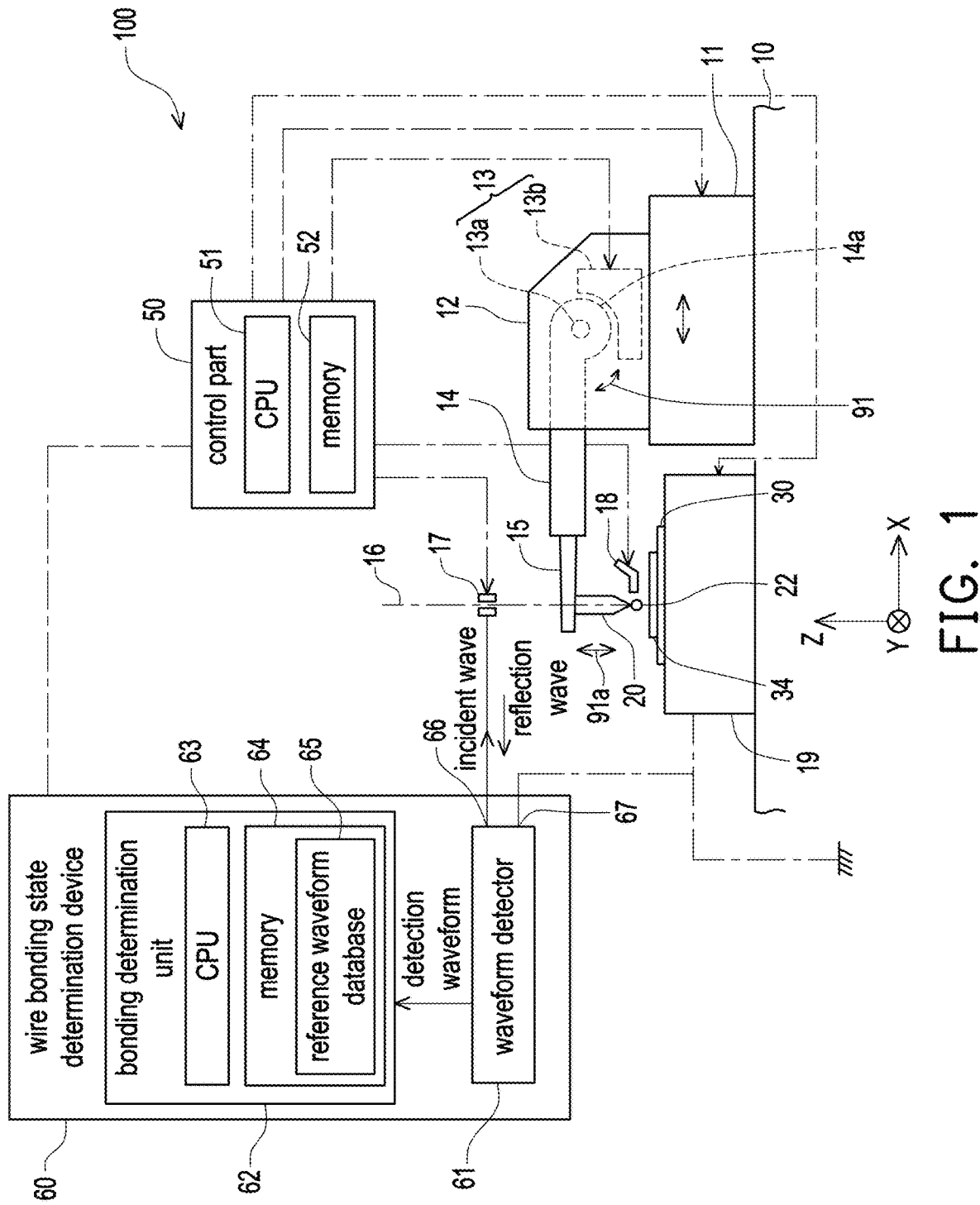
FIG. 1 is a configuration diagram of a wire bonding apparatus to which a wire bonding state determination device of an embodiment is attached.

Hereinafter, a wire bonding state determination device 60 of an embodiment is described with reference to the drawings. Firstly, a wire bonding apparatus 100, to which the wire bonding state determination device 60 of the embodiment is attached, is described. As shown in FIG. 1, the wire bonding apparatus 100 includes: a base 10, an XY table 11, a bonding head 12, a Z-direction motor 13, a bonding arm 14, an ultrasonic horn 15, a capillary 20, a damper 17, a discharge electrode 18, a bonding stage 19, and a control part 50. Moreover, in the following descriptions, a direction in which the bonding arm 14 or the ultrasonic horn 15 extends is described as an X-direction, a direction perpendicular to the X-direction in a horizontal plane is described as a Y-direction, and an up-down direction is described as a Z-direction.

The XY table 11 is attached onto the base 10 and makes an object installed on the upper side move in the X-direction and the Y-direction.

The bonding head 12 is attached onto the XY table 11 and moves in the X-direction and the Y-direction by the XY table 11. The Z-direction motor 13 and the bonding arm 14 driven by the Z-direction motor 13 are stored inside the bonding head 12. The Z-direction motor 13 includes a fixed element 13b. A root part 14a of the bonding arm 14 is a rotator that faces the fixed element 13b of the Z-direction motor 13 and is attached in a way of rotating freely around a shaft 13a of the Z-direction motor 13.

The ultrasonic horn 15 is attached to a front end of the bonding arm 14 in the X-direction, and the capillary 20 is attached to a front end of the ultrasonic horn 15. The ultrasonic horn 15 ultrasonically vibrates the capillary 20 which is attached to the front end by vibration of an ultrasonic vibrator (not shown). As described later, the capillary 20 is equipped with, inside itself, a through-hole 21 penetrating in the up-down direction, and a wire 16 is inserted in the through-hole 21.

In addition, the damper 17 is arranged above the front end of the ultrasonic horn 15. The damper 17 opens/closes to release/hold the wire 16.

The discharge electrode 18 is arranged above the bonding stage 19. The discharge electrode 18 performs discharge between it and the wire 16 which is inserted in the capillary 20 and is extended from a front end of the capillary 20, and melts the wire 16 to form a free air ball 22.

The bonding stage 19 adsorbs and fixes a substrate 30 on which a semiconductor chip 34 is mounted on an upper surface, and heats the substrate 30 and the semiconductor chip 34 by a heater (not shown).

When the root part 14a of the bonding arm 14 which constitutes a rotator rotates as shown by an arrow 91 in FIG. 1 by an electromagnetic force of the fixed element 13b of the Z-direction motor 13 of the bonding head 12, the capillary 20 attached to the front end of the ultrasonic horn 15 moves in the Z-direction as shown by an arrow 91a. In addition, the bonding stage 19 moves in the X-direction and the Y-direction by the XY table 11. Thus, the capillary 20 moves in the X-direction, the Y-direction, and the Z-direction by the XY table 11 and the Z-direction motor 13.

The XY table 11, the Z-direction motor 13, the damper 17, the discharge electrode 18, and the bonding stage 19 are connected to the control part 50 and are driven based on commands of the control part 50. The control part 50 adjusts the position of the capillary 20 in the X-direction, the Y-direction, and the Z-direction by the XY table 11 and the Z-direction motor 13, and controls opening/closing of the damper 17, driving of the discharge electrode 18, and heating of the bonding stage 19.

The control part 50 is a computer which includes, inside itself, a CPU 51 serving as a processor that performs information processing, and a memory 52 that stores an operation program, operation data, and the like.

Figure 2:
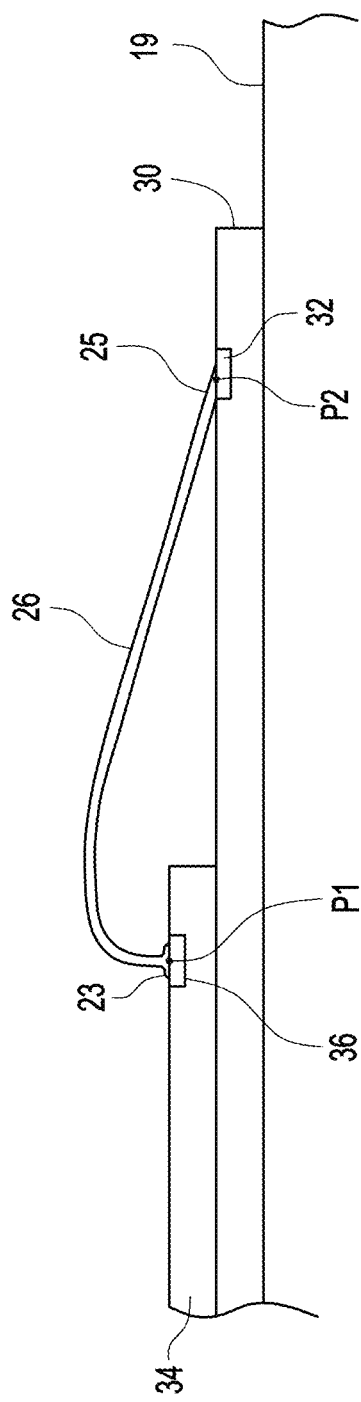
FIG. 2 is an elevation view showing a semiconductor device in which an electrode of a semiconductor chip and an electrode of a substrate are connected by a wire using the wire bonding apparatus shown in FIG. 1.

As shown in FIG. 2, the wire bonding apparatus 100 is a device that connects a pad 36 which is an electrode of the semiconductor chip 34 and a lead 32 which is another electrode of the substrate 30 by a loop wire 26 to manufacture a semiconductor device.

Hereinafter, each step of wire bonding performed by the wire bonding apparatus 100 is simply described with reference to FIGS. 3A to 3D.

Figure 3A:
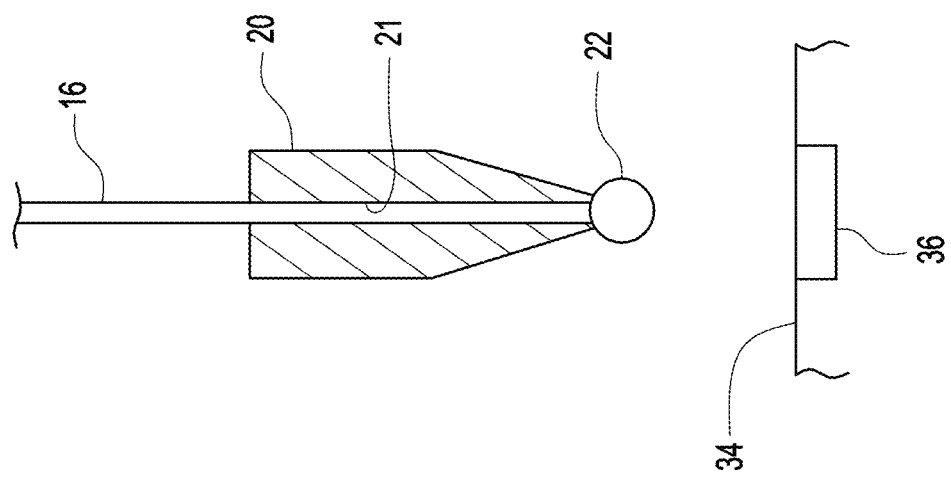
FIG. 3A is an elevation view showing a wire bonding step performed by the wire bonding apparatus shown in FIG. 1, and is a diagram showing a state in which a free air ball is formed.

As shown in FIG. 3A, the wire 16 is inserted in the through-hole 21 of the capillary 20. The control part 50 of the wire bonding apparatus 100 makes discharge occur between the discharge electrode 18 shown in FIG. 1 and the wire 16 extended from the front end of the capillary 20, to mold the wire 16 into the free air ball 22 having a spherical shape.

Figure 3B:
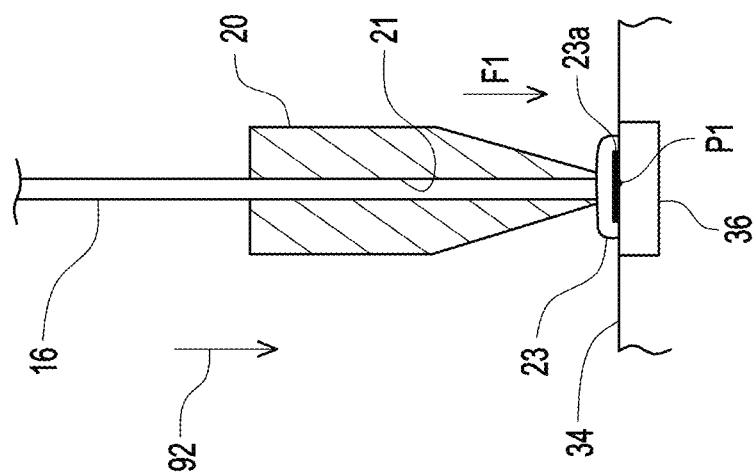
FIG. 3B is an elevation view showing the wire bonding step performed by the wire bonding apparatus shown in FIG. 1, and is a diagram showing a state in which the free air ball is crimped onto the electrode and a crimp ball is formed.

Next, the control part 50 performs ball bonding in which the capillary 20 is lowered as shown by an arrow 92 of FIG. 3B, and the free air ball 22 is pressed onto the pad 36 of the semiconductor chip 34 with a load F1 by the front end of the capillary 20. Then, the free air ball 22 is crimped on the pad 36 and is molded into a crimp ball 23 having a disc shape. Between a lower surface of the crimp ball 23 and an upper surface of the pad 36, a first bonding surface 23a is formed on which a metal for forming the crimp ball 23 and a metal of the pad 36 are bonded. The first bonding surface 23a is a crimp surface between the crimp ball 23 and the pad 36 and constitutes a first bond point P1.

Figure 3C:
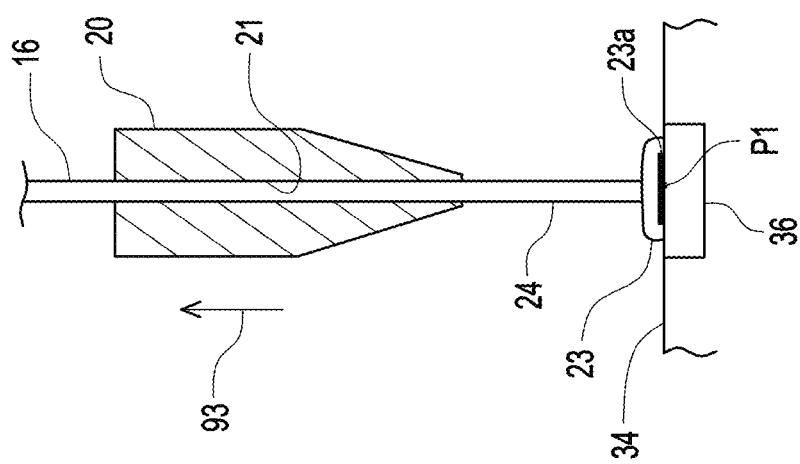
FIG. 3C is an elevation view showing the wire bonding step performed by the wire bonding apparatus shown in FIG. 1, and is a diagram showing a state in which a wire tail is extended from a front end of a capillary.

Next, the control part 50 raises the capillary 20 as shown by an arrow 93 of FIG. 3C to make a wire tail 24 extend from the front end of the capillary 20.

Figure 3D:
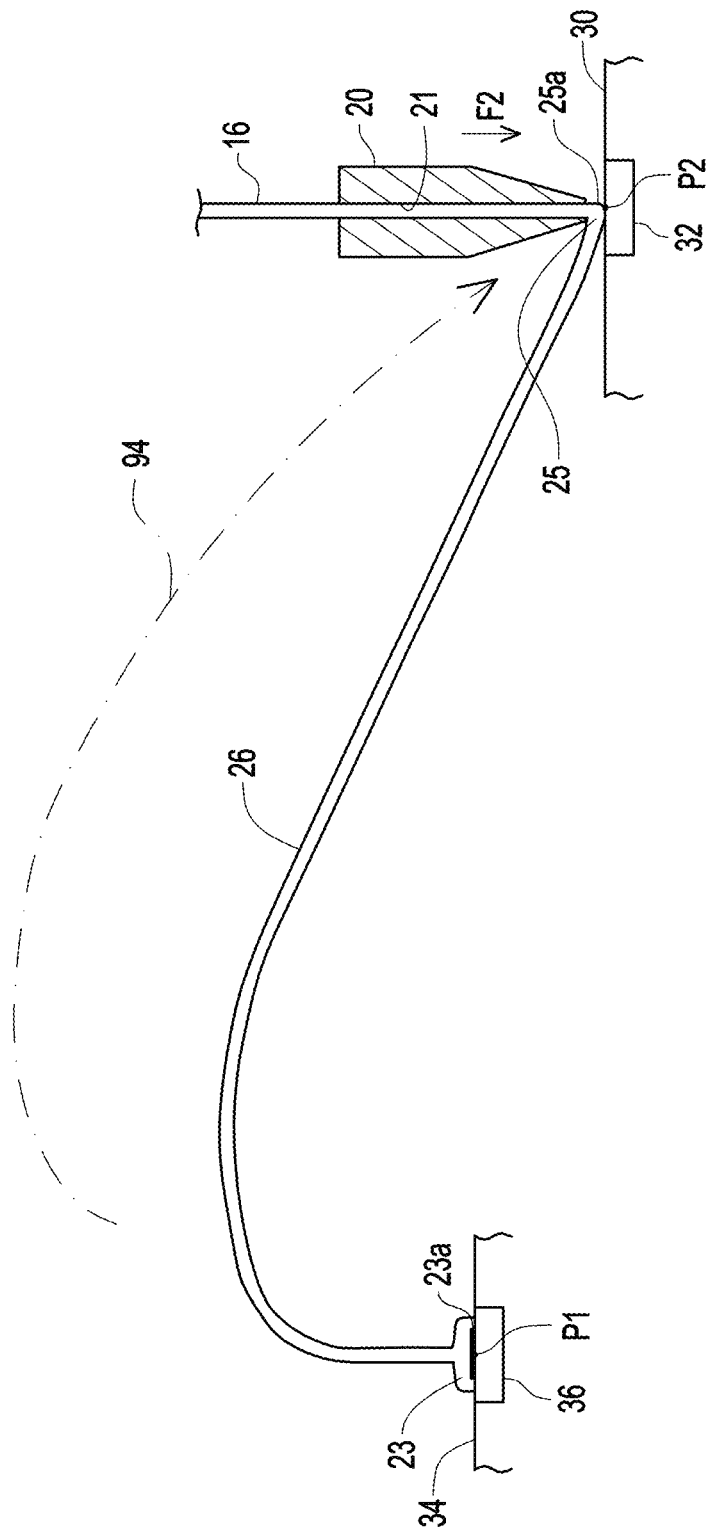
FIG. 3D is an elevation view showing the wire bonding step performed by the wire bonding apparatus shown in FIG. 1, and is a diagram showing a state in which the front end of the capillary is looped to perform stitch bonding on the electrode of the substrate.

Thereafter, the control part 50 loops the front end of the capillary 20 from the pad 36 of the semiconductor chip 34 toward the lead 32 of the substrate 30 as shown by an arrow 94 of FIG. 3D, presses a side surface of the wire 16 onto the lead 32 of the substrate 30 with a load F2 by the front end of the capillary 20 to perform stitch bonding, and crimps the side surface of the wire 16 onto the lead 32. The side surface of the wire 16 becomes a second bonding part 25 when crimped. A lower surface of the second bonding part 25 is bonded to the lead 32, and a second bonding surface 25a is formed. The second bonding surface 25a is a crimp surface between the side surface of the wire 16 and the lead 32, and constitutes a second bond point P2.

Thereafter, the control part 50 closes the damper 17, raises the capillary 20, and cuts the wire 16 at the second bonding part 25. Accordingly, as shown in FIG. 2, a semiconductor device is configured in which the first bond point P1 and the second bond point P2 are connected by the loop wire 26.

Next, the wire bonding state determination device 60 of the embodiment is described with reference to FIGS. 1 and 4.

As shown in FIG. 1, the wire bonding state determination device 60 of the embodiment is configured by a waveform detector 61 and a bonding determination unit 62. The waveform detector 61 includes a first terminal 66 and a second terminal 67. The first terminal 66 is connected to the damper 17. In addition, the second terminal 67 is connected to the bonding stage 19 and is grounded.

Figure 4:
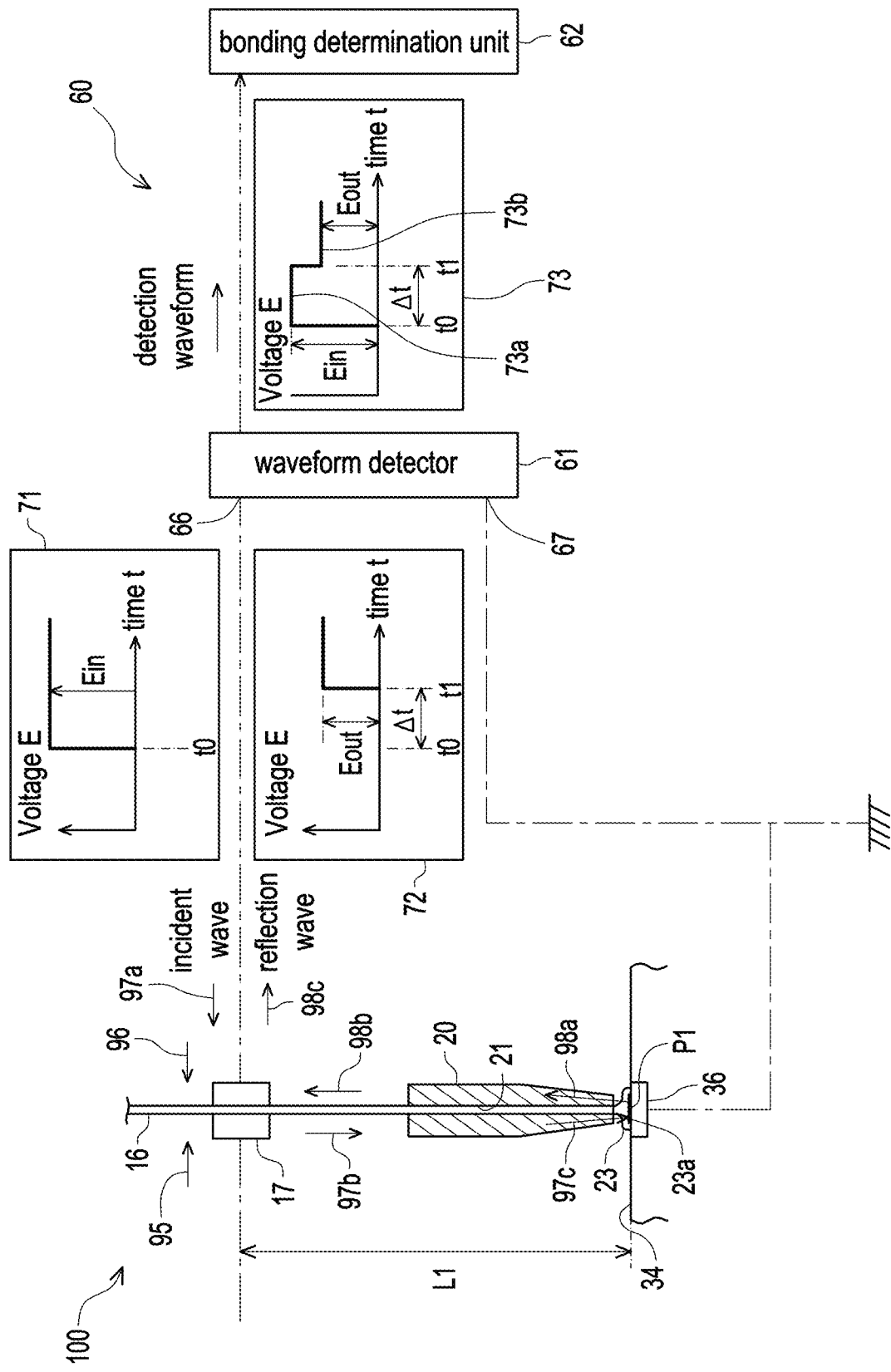
FIG. 4 is an explanatory diagram showing a waveform detection step in the wire bonding state determination device of the embodiment.

As shown in FIG. 4, the waveform detector 61 makes an incident wave 71 having a prescribed electric waveform incident to the wire 16 from the first terminal 66, and detects a detection waveform 73 including a transmission waveform 73a of the wire 16 and a reflection waveform 73b from the first bonding surface 23a between the pad 36 and the wire 16, and then outputs the detection waveform 73 to the bonding determination unit 62. Moreover, the waveform detector 61 may be configured using a commercially available network analyzer.

Based on the detection waveform 73 which is input from the waveform detector 61 and includes the transmission waveform 73a of the wire 16 and the reflection waveform 73b from the first bonding surface 23a, the bonding determination unit 62 determines the bonding state between the wire 16 and the pad 36.

As shown in FIG. 1, the bonding determination unit 62 is a computer which includes, inside itself, a CPU 63 serving as a processor that performs information processing and a memory 64 in which an operation program, data, and the like are stored. A reference waveform database 65 described later is stored inside the memory 64.

As shown in FIG. 1, the wire bonding state determination device 60 is connected to the control part 50 of the wire bonding apparatus 100, and receives/transmits information from/to the control part 50.

Next, operations of the wire bonding state determination device 60 of the embodiment are described with reference to FIGS. 4 to 8. In the following descriptions, as shown in FIG. 4, a case is described where a voltage waveform of which the voltage changes stepwise from zero to Ein at a time point t0 is incident to the wire 16 as a prescribed electric waveform. An electric waveform having any other shapes may be incident as the prescribed electric waveform.

As described previously with reference to FIGS. 3A to 3B, the control part 50 lowers the capillary 20, crimps the free air ball 22 onto the pad 36 to form the crimp ball 23, and bonds the crimp ball 23 and the pad 36. Accordingly, between the crimp ball 23 and the pad 36, the first bonding surface 23a is formed on which the metal for forming the crimp ball 23 and the metal of the pad 36 are bonded.

The control part 50 releases the load F1 which is applied during the molding of the crimp ball 23, and slightly raises the front end of the capillary 20 from an upper surface of the crimp ball 23. In addition, the control part 50 outputs a command for closing the damper 17. According to the command, the damper 17 is closed, the damper 17 and the wire 16 are electrically connected, and the wire 16 and the first terminal 66 of the waveform detector 61 are connected.

As shown in FIG. 4, the waveform detector 61 outputs, from the first terminal 66, the incident wave 71 of which the voltage changes stepwise from zero to Ein at the time point t0. The incident wave 71 which is output from the first terminal 66 enters the damper 17 as shown by an arrow 97a in FIG. 4, and is transmitted from the damper 17 to the wire 16. Then, as shown by an arrow 97b in FIG. 4, the incident wave 71 is propagated through the wire 16 toward the crimp ball 23. Then, when reaching the first bonding surface 23a as shown by an arrow 97c in FIG. 4, the incident wave 71 is reflected by the first bonding surface 23a and becomes a reflection wave 72. The reflection wave 72 is propagated from the first bonding surface 23a toward the wire 16 as shown by an arrow 98a in FIG. 4, and is propagated through the inside of the wire 16 toward the damper 17 as shown by an arrow 98b in FIG. 4. Then, the reflection wave 72 is propagated from the damper 17 toward the first terminal 66 of the waveform detector 61. As shown in FIG. 4, the reflection wave 72 has a waveform of which the voltage changes stepwise from zero to Eout. The reflection wave 72 returns to the waveform detector 61 at a time point t1 after time Δt from the time point t0 at which the incident wave 71 is output. The reflection wave 72 returning to the waveform detector 61 at the time point t1 has a voltage waveform of which the voltage changes stepwise from zero to Eout at the time point t1.

As shown in FIG. 4, in a period from the time point to at which the incident wave 71 is output to the time point t1 at which the reflection wave 72 returns, the waveform detector 61 detects the transmission waveform 73a of which the voltage changes stepwise from zero to Ein in the same manner as the incident wave 71 transmitted by the wire (waveform detection step). Then, after the time point t1 at which the reflection wave 72 returns, the reflection waveform 73b having the voltage Eout is detected. Here, a distance between the clamper 17 and the first bonding surface 23a of the crimp ball 23 is set as L1, and the time Δt from the time point to at which the incident wave 71 is output to the time point t1 at which the reflection wave 72 returns to the waveform detector 61 is expressed by the following equation:

$$\Delta t = 2*L/(\text{propagation speed of electric waveform in wire}) \quad \text{(Equation 1)}.$$

The propagation speed of the electric waveform in the wire 16 is a speed close to a light speed, and thus the time Δt is extremely short and is about a few picoseconds. Moreover, the length of a connection line between the first terminal 66 of the waveform detector 61 and the clamper 17 is ignored in Equation 1, but the time Δt may be calculated in consideration of the length of the connection line. The same also applies to the cases of time Δt2, Δt83, Δt82, and Δt81 described later.

Figure 5:
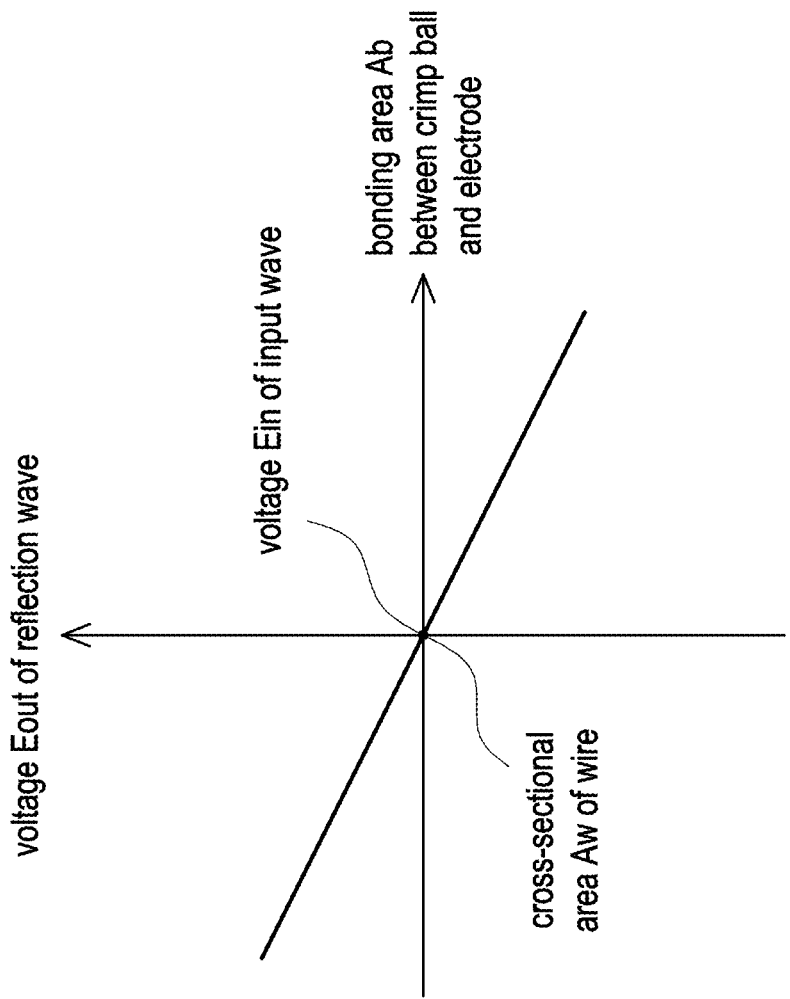
FIG. 5 is a graph showing a change in voltage of a reflection wave with respect to a bonding area between the crimp ball and the electrode.
Figure 5:
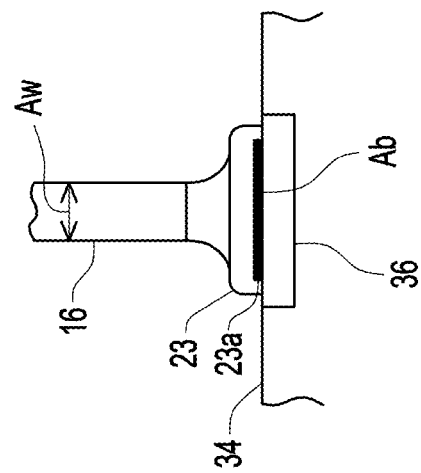

The voltage Eout of the reflection wave 72 or the reflection waveform 73b shown in FIG. 4 changes according to a bonding area Ab of the first bonding surface 23a between the crimp ball 23 and the pad 36. As shown in FIG. 5, when the bonding area Ab of the first bonding surface 23a is the same as a cross-sectional area Aw of the wire 16 which is a prescribed area, the impedance of the first bonding surface 23a becomes the same as the impedance of the wire 16, and thus the voltage Eout of the reflection wave 72 or the reflection waveform 73b becomes the same as the voltage Ein of the incident wave 71 transmitted through the inside of the wire 16.

When the bonding area Ab of the first bonding surface 23a becomes larger than the cross-sectional area Aw of the wire 16 which is a prescribed area, the impedance of the first bonding surface 23a becomes smaller, and thus the voltage Eout of the reflection wave 72 or the reflection waveform 73b becomes smaller than Ein. On the contrary, when the bonding area Ab of the first bonding surface 23a becomes smaller than the cross-sectional area Aw of the wire 16 which is a prescribed area, the impedance of the first bonding surface 23a becomes greater than the impedance of the wire 16, and thus the voltage Eout of the reflection wave 72 or the reflection waveform 73b becomes greater than Ein.

Figure 6:
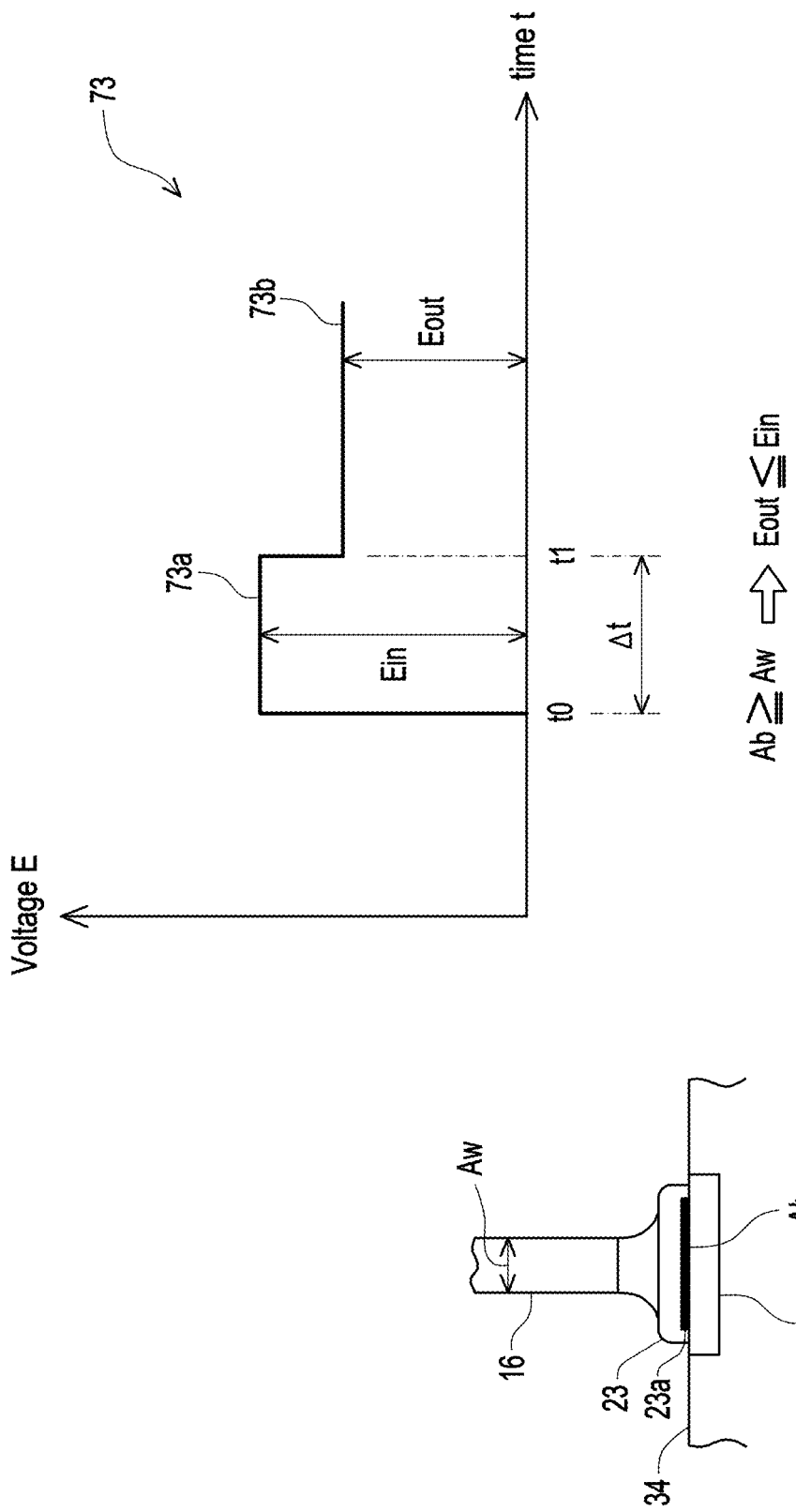
FIG. 6 is a diagram showing a waveform which is detected by a waveform detector when the bonding area between the crimp ball and the electrode is larger than a cross-sectional area of the wire.

Thus, as shown in FIG. 6, when the bonding area Ab of the first bonding surface 23a is larger than the cross-sectional area Aw of the wire 16 which is a prescribed area, the voltage Eout of the reflection waveform 73b included in the detection waveform 73 is smaller than the voltage Ein of the transmission waveform 73a included in the detection waveform 73.

Figure 7:
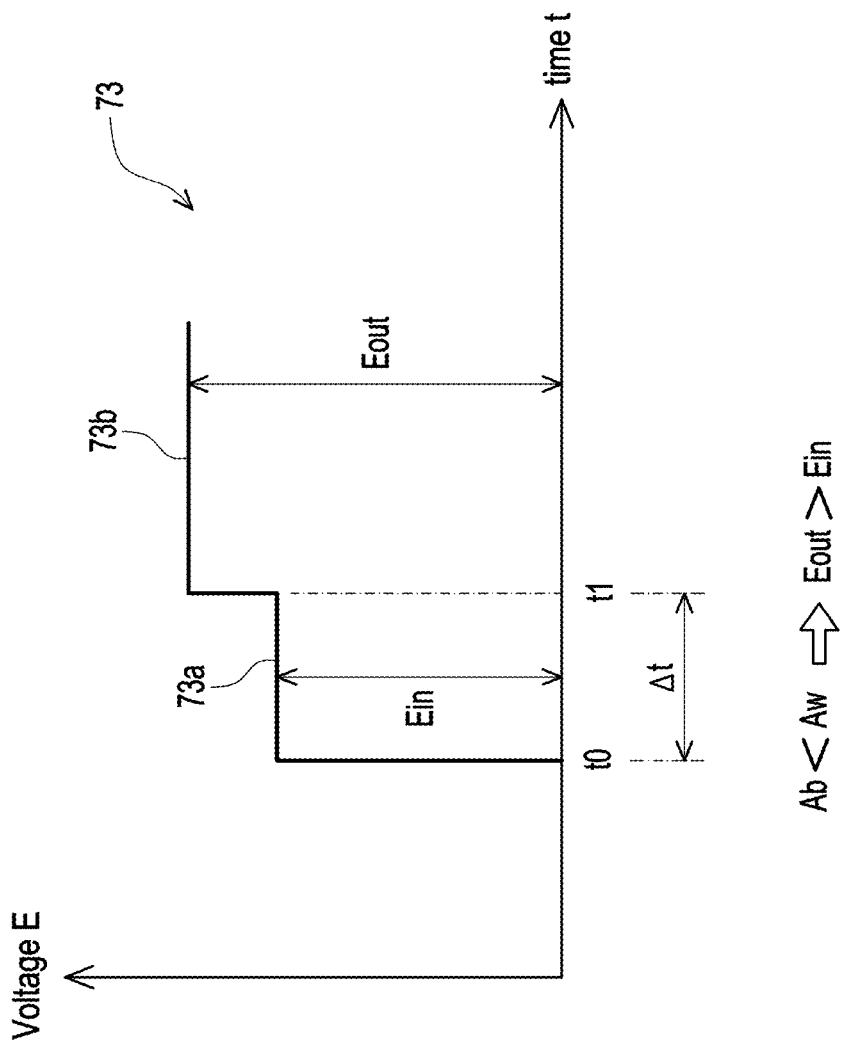
FIG. 7 is a diagram showing a waveform which is detected by the waveform detector when the bonding area between the crimp ball and the electrode is smaller than the cross-sectional area of the wire.
Figure 7:
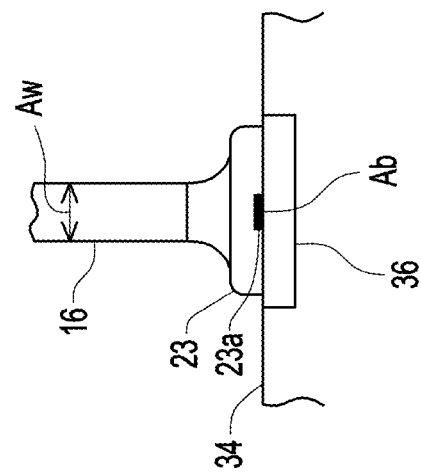

On the contrary, as shown in FIG. 7, when the bonding area Ab of the first bonding surface 23a is smaller than the cross-sectional area Aw of the wire 16, the voltage Eout of the reflection waveform 73b included in the detection waveform 73 is greater than the voltage Ein of the transmission waveform 73a included in the detection waveform 73.

Thus, the CPU 63 of the bonding determination unit 62 acquires, as the voltage Ein of the transmission waveform 73a, a voltage value of the transmission waveform 73a immediately after the time point t0 at which the output of the incident wave 71 is started; and the CPU 63 of the bonding determination unit 62 acquires, as the voltage Eout of the reflection waveform 73b, a voltage value of the reflection waveform 73b immediately after the time point t1. Then, by comparing the acquired voltage Ein of the transmission waveform 73a and the acquired voltage Eout of the reflection waveform 73b, the CPU 63 of the bonding determination unit 62 determines whether the bonding area Ab of the first bonding surface 23a is larger or smaller than the cross-sectional area Aw of the wire 16 (bonding determination step).

That is, the CPU 63 of the bonding determination unit 62 determines that the bonding area Ab of the first bonding surface 23a is smaller than the cross-sectional area Aw of the wire 16 when the magnitude of the acquired voltage Eout of the reflection waveform 73b is greater than that of the acquired voltage Ein of the transmission waveform 73a, and determines that the bonding area Ab of the first bonding surface 23a is equal to or larger than the cross-sectional area Aw of the wire 16 when the magnitude of the acquired voltage Eout of the reflection waveform 73b is equal to or smaller than that of the voltage Ein of the transmission waveform 73a.

As described above, the wire bonding state determination device 60 can determine whether or not the bonding area Ab of the first bonding surface 23a is larger than the cross-sectional area Aw of the wire 16 by an easy method in which the incident wave 71 is incident to the wire 16, the voltage Ein of the transmission waveform 73a in the wire 16 and the voltage Eout of the reflection waveform 73b from the first bonding surface 23a between the crimp ball 23 and the pad 36 are detected, and the voltage Ein and the voltage Eout are compared.

In addition, the CPU 63 of the bonding determination unit 62 may determine that the bonding state of the first bonding surface 23a is good when the magnitude of the acquired voltage Eout of the reflection waveform 73b is equal to or smaller than that of the voltage Ein of the transmission waveform 73a, and determine that the bonding state of the first bonding surface 23a is defect when the magnitude of the acquired voltage Eout of the reflection waveform 73b is greater than that of the acquired voltage Ein of the transmission waveform 73a. Moreover, in the bonding determination step, it is described that the bonding state is determined with reference to the cross-sectional area of the wire, but it is not limited hereto. For example, the bonding state may be judged by a ratio of the bonding area with respect to the lower surface of the crimp ball 23, a ratio of the bonding area with respect to a side surface of the wire of the second bonding part 25 or a stitch bonding part described later, or the like.

Figure 8:
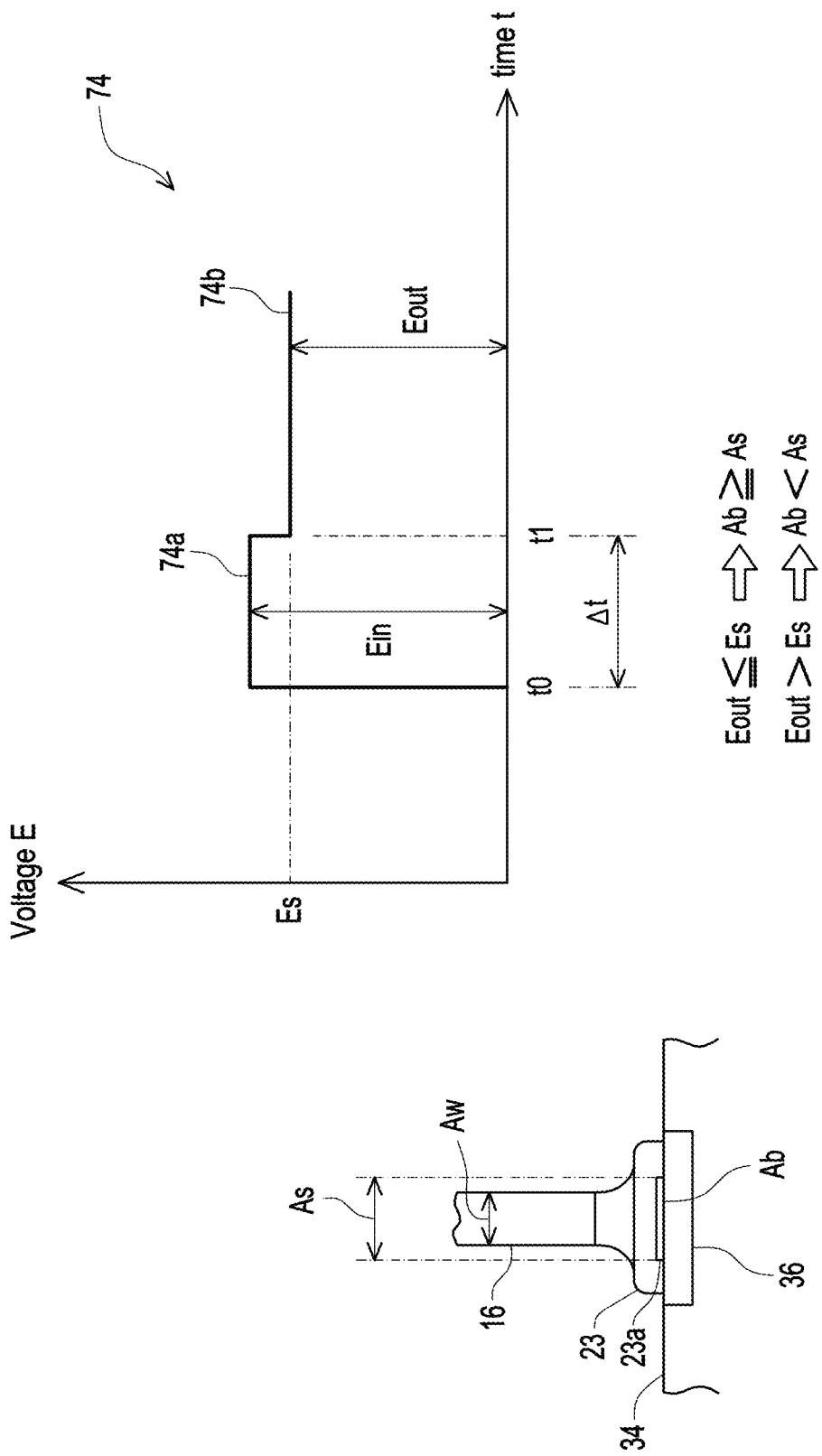
FIG. 8 is a diagram showing a reference waveform which is detected by the waveform detector when a prescribed electric waveform is incident to the wire in a case where a bonding state between the crimp ball and the electrode is good.

Next, with reference to FIG. 8, another operation of the wire bonding state determination device 60 of the embodiment is described. As shown in FIG. 8, a semiconductor device is prepared which includes a reference first bond part P1s where the bonding state between the pad 36 and the wire 16 is good and the bonding area Ab of the first bonding surface 23a between the pad 36 and the wire 16 becomes a reference bonding area As. Then, as a reference waveform 74, a voltage waveform is acquired which includes a transmission waveform 74a of the wire 16 and a reflection waveform 74b from the first bonding surface 23a when the incident wave 71 is incident to the wire 16 from the waveform detector 61. Then, the acquired reference waveform 74 is stored in the reference waveform database 65 in the memory 64 of the bonding determination unit 62 (reference waveform detection step).

As shown in FIG. 8, when the reference bonding area As of the first bonding surface 23a is larger than the cross-sectional area Aw of the wire 16, the voltage Eout of the reflection waveform 74b included in the reference waveform 74 becomes Es which is smaller than the voltage Ein of the transmission waveform 74a included in the reference waveform 74.

As described previously with reference to FIG. 5, the voltage Eout becomes lower than the voltage Es when the bonding area Ab of the first bonding surface 23a is equal to or larger than the reference bonding area As which is a prescribed area. On the contrary, the voltage Eout becomes higher than the voltage Es when the bonding area Ab of the first bonding surface 23a is smaller than the reference bonding area As which is a prescribed area.

When determination of the bonding area of the first bonding surface 23a is performed, as described with reference to FIG. 4, the wire bonding state determination device 60 makes the incident wave 71, of which the voltage changes stepwise from zero to Ein at the time point t0, incident from the waveform detector 61 to the damper 17, and detects the detection waveform 73 including the transmission waveform 73a and the reflection waveform 73b by the waveform detector 61. The CPU 63 of the bonding determination unit 62 acquires, as the voltage Eout, a voltage value of the reflection waveform 73b immediately after the time point t1. Then, the CPU 63 of the bonding determination unit 62 compares the voltage Es of the reflection waveform 74b included in the reference waveform 74 stored in the reference waveform database 65 and the voltage Eout of the reflection waveform 73b, and determines whether the bonding area Ab of the first bonding surface 23a is larger or smaller than the reference bonding area As (bonding determination step).

That is, the CPU 63 of the bonding determination unit 62 determines that the bonding area Ab of the first bonding surface 23a is smaller than the reference bonding area As when the magnitude of the acquired voltage Eout of the reflection waveform 73b is greater than that of the voltage Es of the reflection waveform 74b included in the reference waveform 74, and determines that the bonding area Ab of the first bonding surface 23a is equal to or larger than the reference bonding area As when the magnitude of the acquired voltage Eout of the reflection waveform 73b is equal to or smaller than that of the voltage Es of the reflection waveform 74b included in the reference waveform 74.

Accordingly, it is possible to detect whether or not the bonding area Ab of the pad 36 and the wire 16 is larger than the reference bonding area As by an easy method. In addition, the bonding determination unit 62 may judge that the bonding state of the first bonding surface 23a is defect when the magnitude of the voltage Eout of the reflection waveform 73b is greater than that of the voltage Es of the reflection waveform 74b included in the reference waveform 74, and judge that the bonding state of the first bonding surface 23a is good when the magnitude of the voltage Eout of the reflection waveform 73b is equal to or smaller than that of the voltage Es of the reflection waveform 74b included in the reference waveform 74.

In the above descriptions, description has been made on the first bonding surface 23a that the bonding is performed by the ball bonding, and the bonding area Ab of the first bonding surface 23a between the crimp ball 23 and the pad 36 is determined, but the description is not limited hereto, and can also be applied to the second bonding surface 25a of the second bonding part 25 bonded by the stitch bonding between the side surface of the wire 16 and the lead 32.

Figure 9:
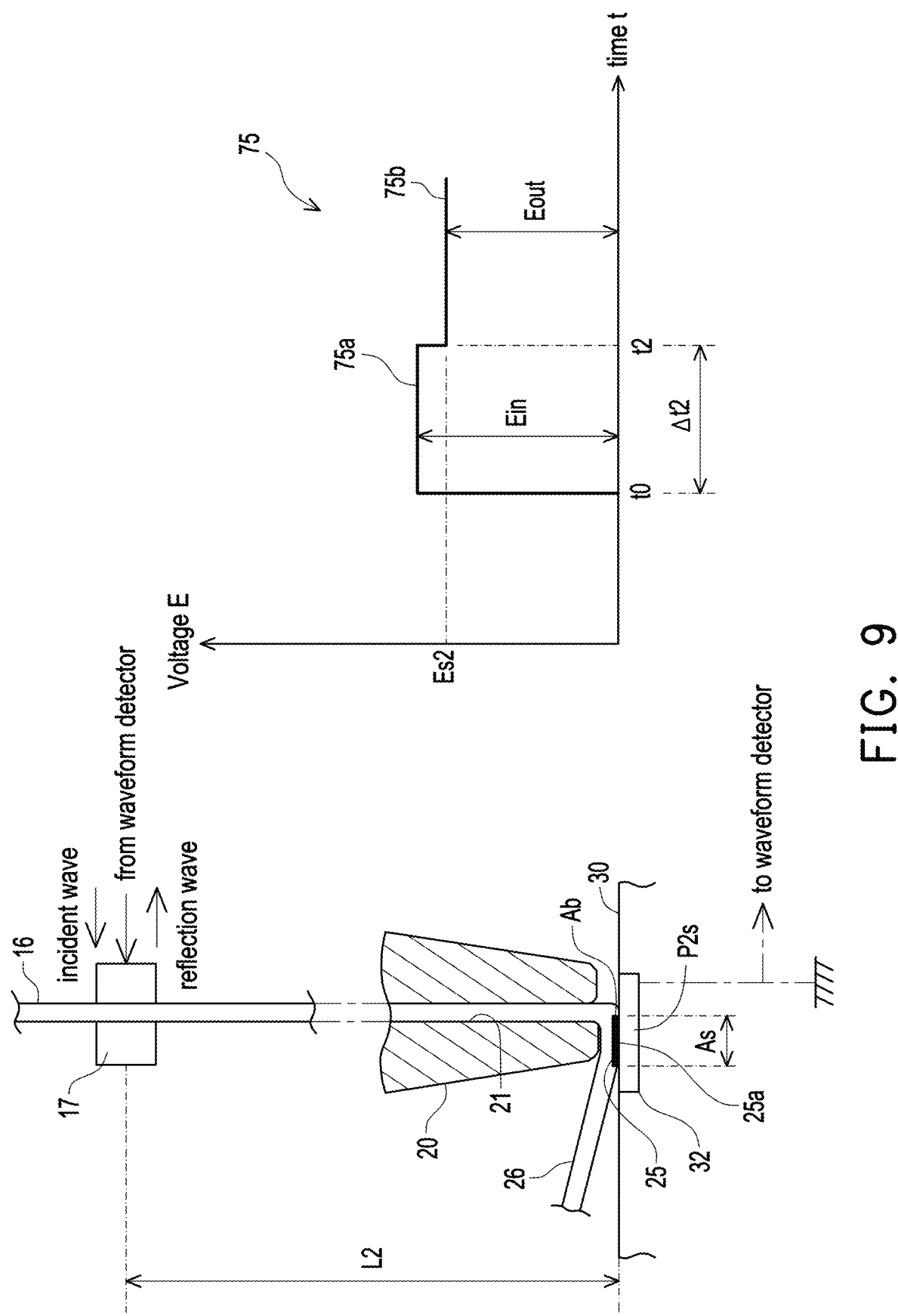
FIG. 9 is a diagram showing a reference waveform which is detected by the waveform detector when the prescribed electric waveform is incident to the wire in a case where a bonding state of a second bonding part bonded by stitch bonding is good.

As described previously with reference to FIG. 8, as shown in FIG. 9, a reference second bond part P2s is prepared at which the bonding state between the lead 32 and the side surface of the wire 16 is good and the bonding area Ab of the second bonding surface 25a between the lead 32 and the side surface of the wire 16 becomes the reference bonding area As. Then, the incident wave 71 is incident to the wire 16 from the waveform detector 61 at the time point t0. When the incident wave 71 is incident to the wire 16 from the waveform detector 61 at the time point t0, the reflection wave 72 from the second bonding surface 25a returns to the waveform detector 61 at a time point t2 after time Δt2 from t0.

Here, a distance between the damper 17 and the second bonding surface 25a of the lead 32 is set as L2, and the time Δt2 is expressed by the following equation:

$$\Delta t2 = 2*L2/(\text{propagation speed of electric waveform in wire}) \quad \text{(Equation 2)}.$$

Thus, the waveform detector 61 detects a transmission waveform 75a of which the voltage changes stepwise from zero to Ein in a period from the time point t0 to the time point t2 at which the reflection wave 72 returns, and detects a reflection waveform 75b having the voltage Eout after the time point t2 at which the reflection wave 72 returns. The waveform detector 61 acquires, as a reference waveform 75, a voltage waveform including the transmission waveform 75a of the wire 16 and the reflection waveform 75b from the second bonding surface 25a. Then, the acquired reference waveform 75 is stored in the reference waveform database 65 in the memory 64 of the bonding determination unit 62 (reference waveform detection step).

As shown in FIG. 9, when the reference bonding area As of the second bonding surface 25a is greater than that of the cross-sectional area Aw of the wire 16, the voltage Eout of the reflection waveform 75b included in the reference waveform 75 becomes Es2 which is smaller than the voltage Ein of the transmission waveform 75a included in the reference waveform 75.

As described previously with reference to FIG. 8, the voltage Eout becomes lower than the voltage Es2 when the bonding area Ab of the second bonding surface 25a is equal to or larger than the reference bonding area As which is a prescribed area. On the contrary, the voltage Eout becomes higher than the voltage Es2 when the bonding area Ab of the second bonding surface 25a is smaller than the reference bonding area As which is a prescribed area.

As described previously with reference to FIG. 8, when determination of the bonding area of the second bonding surface 25a is performed, the wire bonding state determination device 60 makes the incident wave 71 incident from the waveform detector 61 to the damper 17. The CPU 63 of the bonding determination unit 62 determines that the bonding area Ab of the second bonding surface 25a is smaller than the reference bonding area As when the magnitude of the voltage Eout of the reflection waveform 73b is greater than that of the voltage Es2, and determines that the bonding area Ab of the second bonding surface 25a is equal to or larger than the reference bonding area As when the magnitude of the voltage Eout of the reflection waveform 73b is equal to or smaller than that of the voltage Es2.

Moreover, as described with reference to FIG. 8, the quality of bonding of the second bonding surface 25a may be determined based on the magnitude of the voltage Eout of the reflection waveform 73b.

Next, another operation of the wire bonding state determination device 60 is described with reference to FIGS. 10 and 11. The wire bonding state determination device 60 can also be applied to determine the bonding state of a bonding surface of an intermediate stitch bonding part in chain bonding, wherein in the chain bonding, stitch bonding is performed multiple times after the ball bonding to continuously connect, by the wire 16, the lead 32 of the substrate 30 and the pad 36 of each layer of a plurality of the semiconductor chips 34 which are laminated and mounted on the substrate 30 into a plurality of layers.

An example of the chain bonding is described with reference to FIG. 10. The example shown in FIG. 10 is reverse bonding in which bonding is continuously performed from the lead 32 of the substrate 30 toward each of pads 136 and 236 of laminated semiconductor chips 134 and 234.

Figure 10:
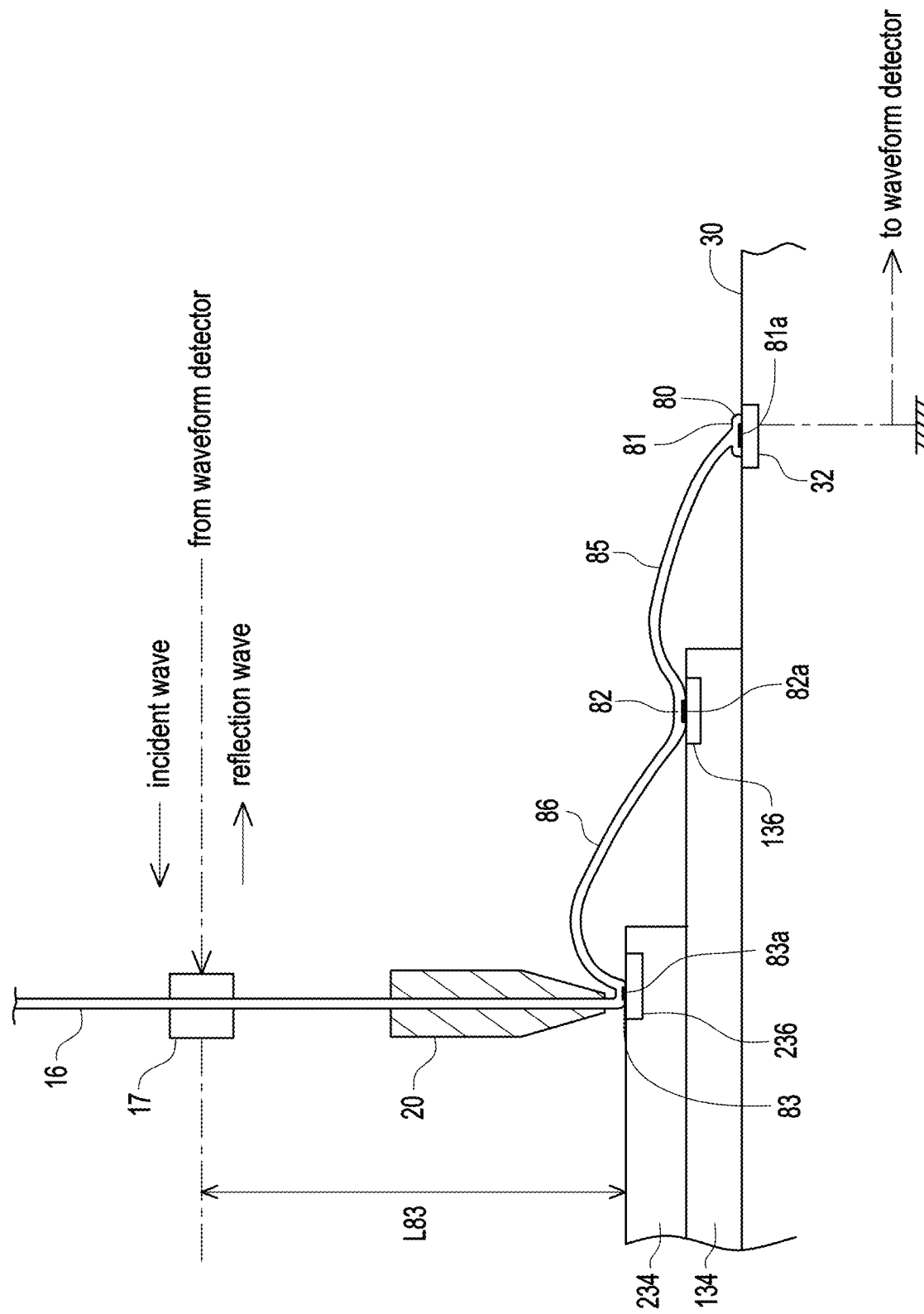
FIG. 10 is a diagram showing a wire loop which is formed by chain bonding.

In the chain bonding shown in FIG. 10, the control part 50 of the wire bonding apparatus 100 firstly performs ball bonding on the lead 32 of the substrate 30 to form a crimp ball 80. A crimp surface between the crimp ball 80 and the lead 32 is a first bonding surface 81a, and constitutes a first bond part 81. Next, the control part 50 loops the capillary 20 toward the pad 136 of the semiconductor chip 134 which is the first layer, and presses the side surface of the wire 16 onto the pad 136 to perform stitch bonding. A crimp surface between the pad 136 and the side surface of the wire 16 is a second bonding surface 82a, and constitutes a second bond part 82. Similarly, the control part 50 loops the capillary 20 toward the pad 236 of the semiconductor chip 234 which is the second layer, and presses the side surface of the wire 16 onto the pad 236 to perform stitch bonding. A crimp surface between the pad 236 and the side surface of the wire 16 is a third bonding surface 83a, and constitutes a third bond part 83. The first bond part 81 and the second bond part 82 are connected by a loop wire 85, and the second bond part 82 and the third bond part 83 are connected by a loop wire 86.

Next, the judgement on the quality of bonding of the second bonding surface 82a of the second bond part 82 which is the intermediate stitch bonding part in the chain bonding is described.

Before the judgement on the quality of the second bonding surface 82a is performed, as described previously with reference to FIGS. 8 and 9, the wire bonding state determination 60 performs a reference waveform detection step in which a voltage waveform when the incident wave 71 is incident to a reference loop is stored as a reference waveform 76 in the reference waveform database 65, wherein in the reference loop, the bonding state of each bonding surface of the first bonding surface 81a, the second bonding surface 82a, and the third bonding surface 83a is good.

Figure 11:
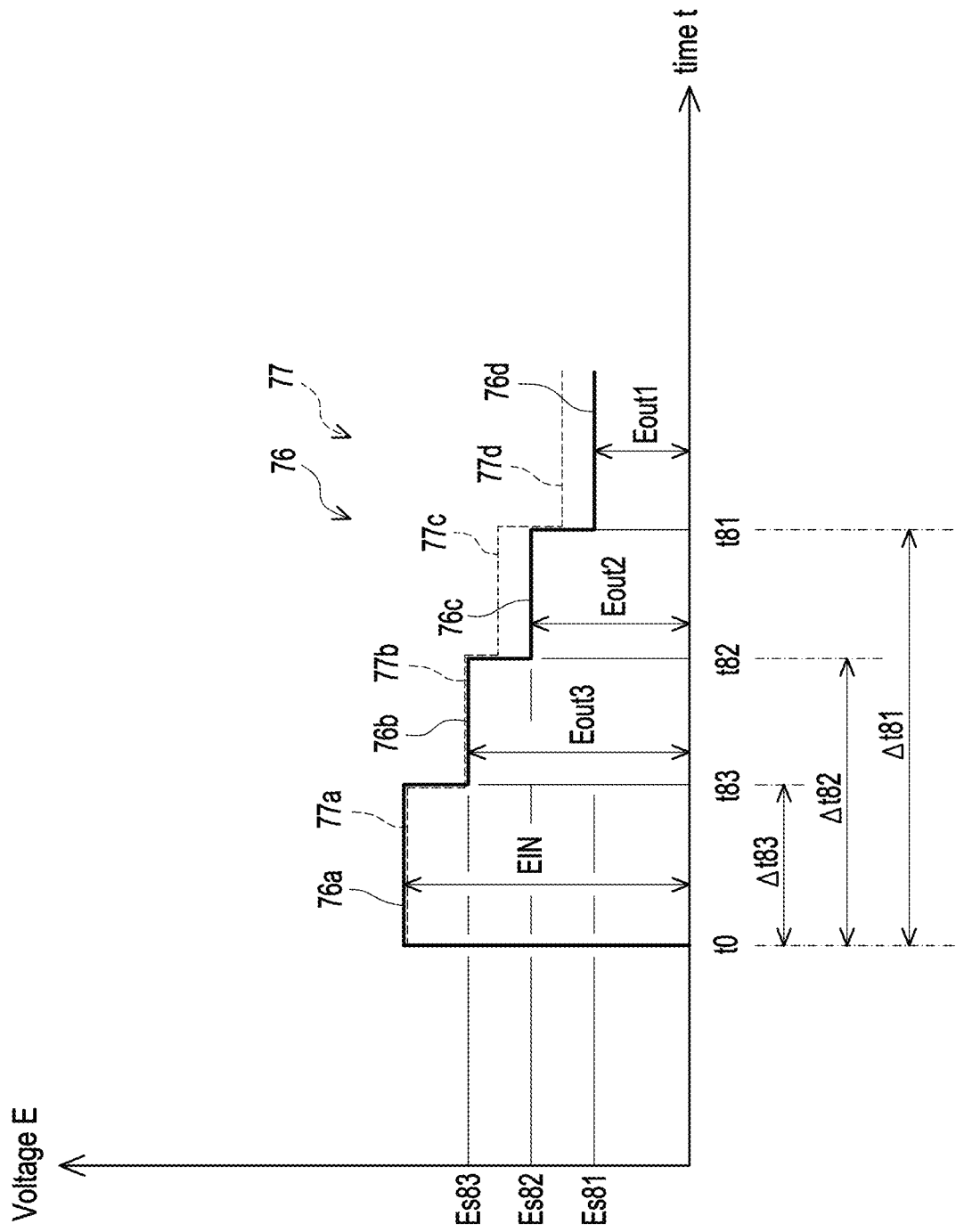
FIG. 11 is a diagram in which a reference waveform, which is detected by the waveform detector when the prescribed electric waveform is incident to the wire after the wire loop shown in FIG. 10 is formed, is shown by a solid line, and a transmission waveform and a reflection waveform which are detected when bonding of a second bond part is defect are shown by a dashed line.

As shown in FIG. 11, the waveform detector 61 inputs, to the damper 17, the incident wave 71 in which the voltage changes stepwise from zero to Ein at the time point t0. The incident wave 71 which is incident to the damper 17 is transmitted from the damper 17 to the wire 16. Then, when reflected by the third bonding surface 83a shown in FIG. 10, the reflection wave 72 having a voltage Eout3 returns to the waveform detector 61. In addition, the incident wave 71 which is transmitted from the third bonding surface 83a to the loop wire 86 is reflected by the second bonding surface 82a, and the reflection wave 72 having a voltage Eout2 returns to the waveform detector 61. Furthermore, the incident wave 71 which is incident from the second bonding surface 82a to the loop wire 85 is reflected by the first bonding surface 81a, and the reflection wave 72 having a voltage Eout1 returns to the waveform detector 61.

The time when the reflection wave 72 from the first bonding surface 81a returns is after time Δt83 from the time point t0, the time when the reflection wave 72 from the second bonding surface 82a returns is after time Δt82 from the time point t0, and the time when the reflection wave 72 from the third bonding surface 83a returns is after time Δt81 from the time point t0. Here, the time Δt83, Δt82, and Δt81 are calculated as follows.

$$\Delta t83 = 2*L83/(\text{propagation speed of electric waveform}) \quad \text{(Equation 3)}$$

$$\Delta t82 = 2 * L82/(\text{propagation speed of electric waveform}) \quad \text{(Equation 3)}$$

$$\Delta t81 = 2 * L81/(\text{propagation speed of electric waveform}) \quad \text{(Equation 3)}$$

Here, L83 is a distance from the damper 17 to the third bonding surface 83a, L82 is a distance which is obtained by adding, to L83, a distance from the third bonding surface 83a to the second bonding surface 82a along the loop wire 86, and L81 is a distance which is obtained by adding, to L82, a distance from the second bonding surface 82a to the first bonding surface 81a along the loop wire 85.

As shown in FIG. 11, the waveform detector 61 detects a transmission waveform 76a having the voltage Ein in a period from the time point t0 to a time point t83, detects a reflection waveform 76b having the voltage Eout3 from the third bonding surface 83a in a period from the time point t83 to a time point t82, detects a reflection waveform 76c having the voltage Eout2 from the second bonding surface 82a in a period from the time point t82 to a time point t81, and detects a reflection waveform 76d having the voltage Eout1 from the first bonding surface 81aafter the time point t81.

The bonding determination unit 62 stores a voltage waveform including the transmission waveform 76a and the reflection waveforms 76b, 76c, and 76d as the reference waveform 76 in the reference waveform database 65, wherein the transmission waveform 76a and the reflection waveforms 76b, 76c, and 76d are detected by the waveform detector 61 when the incident wave 71 is incident to the reference loop in which the bonding state of each bonding surface of the first bonding surface 81a, the second bonding surface 82a, and the third bonding surface 83a is good. In addition, the voltage Eout3, the voltage Eout2, and the voltage Eout1 of the detected reflection waveforms 76b, 76c, and 76d are respectively stored as reference voltage Es83, Es82, and Es81 in the reference waveform database 65.

When determining whether or not the bonding state of the second bonding surface 82a is good, the wire bonding state determination device 60 makes the incident wave 71 incident from the waveform detector 61 to the damper 17 as shown in FIG. 10 after stitch bonding performed on the third bond part 83 is finished. Then, a detection waveform 77 including a transmission waveform 77a and reflection waveforms 77b, 77c, and 77d is detected by the waveform detector 61 as shown by a dashed line in FIG. 11.

Then, the bonding determination unit 62 compares the reflection waveform 77c from the second bonding surface 82a included in the detection waveform 77 and the reflection waveform 76c from the second bonding surface 82a included in the reference waveform 76. When the bonding of the second bonding surface 82a is defect, the voltage of the reflection waveform 77c is higher than the reference voltage Es82. Therefore, the bonding determination unit 62 determines that the bonding of the second bonding surface 82a is defect when the voltage of the reflection waveform 77c is higher than the reference voltage Es82. Meanwhile, the bonding determination unit 62 determines that the bonding of the second bonding surface 82a is good when the voltage of the reflection waveform 77c is equal to or lower than the reference voltage Es82.

As described above, the wire bonding state determination device 60 of the embodiment can determine the quality of bonding of the intermediate stitch bonding part in the chain bonding.

Moreover, in the above descriptions, the reverse bonding in which bonding is continuously performed from the lead 32 of the substrate 30 toward each of the pads 136 and 236 of the laminated semiconductor chips 124 and 234 is described as an example, but the above-described method can also be applied to the judgement on the quality of bonding of the second bond part 82 in chain bonding in which ball bonding is performed on the pad 236 of the semiconductor chip 234 that is the second layer, and stitch bonding is performed on the pad 136 of the semiconductor chip 134 that is the first layer and the lead 32 of the substrate 30.

As described above, the wire bonding state determination device 60 of the embodiment can precisely detect the bonding state between the pad 36 and the wire 16 or the bonding state between the lead 32 and the wire 16.

What is claimed is:

1. A wire bonding state determination method for determining a bonding state between an electrode and a wire is determined after the wire is bonded to the electrode, comprising:

a waveform detection step in which a prescribed electric waveform is incident to the wire, and a transmission waveform of the wire and a reflection waveform from a bonding surface between the electrode and the wire are detected, wherein the transmission waveform is detected after the prescribed electric waveform is incident to the wire and before the prescribed electric waveform is reflected by the bonding surface, and the reflection waveform is detected after the prescribed electric waveform is reflected by the bonding surface, wherein the bonding surface is formed from a metal of the electrode and a metal of the wire which are bonded; and a bonding determination step in which the bonding state between the electrode and the wire is determined by comparing the transmission waveform and the reflection waveform detected by the waveform detection step, wherein in the bonding determination step, a bonding area of the bonding surface is determined to be smaller than a prescribed area when a magnitude of the reflection waveform detected by the waveform detection step is greater than a magnitude of the transmission waveform, and the bonding area of the bonding surface is determined to be equal to or larger than the prescribed area when the magnitude of the reflection waveform is equal to or smaller than the magnitude of the transmission waveform.

2. The wire bonding state determination method according to claim 1, comprising a reference waveform detection step in which the prescribed electric waveform is incident to the wire in a good bonding state with the electrode, and a reflection waveform from the bonding surface are detected as a reference waveform, wherein in the bonding determination step, defect bonding is determined when a magnitude of the reflection waveform detected by the waveform detection step is greater than a magnitude of the reflection waveform included in the reference waveform, and good bonding is determined when the magnitude of the reflection waveform detected by the waveform detection step is equal to or smaller than the magnitude of the reflection waveform included in the reference waveform.

3. The wire bonding state determination method according to claim 2, wherein bonding of the wire to the electrode is performed by ball bonding in which a free air ball formed at a front end of the wire is crimped and bonded to the electrode to form a crimp ball, and the bonding surface is a first bonding surface between the crimp ball and the electrode.

4. The wire bonding state determination method according to claim 1, wherein bonding of the wire to the electrode is performed by ball bonding in which a free air ball formed at a front end of the wire is crimped and bonded to the electrode to form a crimp ball, and the bonding surface is a first bonding surface between the crimp ball and the electrode.

5. A wire bonding state determination device, which determines a bonding state between an electrode and a wire after the wire is bonded to the electrode, comprising:

a waveform detector which makes a prescribed electric waveform incident to the wire, and detects a transmission waveform of the wire and a reflection waveform from a bonding surface between the electrode and the wire, wherein the transmission waveform is detected after the prescribed electric waveform is incident to the wire and before the prescribed electric waveform is reflected by the bonding surface, and the reflection waveform is detected after the prescribed electric waveform is reflected by the bonding surface, wherein the bonding surface is formed from a metal of the electrode and a metal of the wire which are bonded; and a bonding determination unit which determines the bonding state between the electrode and the wire by comparing the transmission waveform and the reflection waveform detected by the waveform detector, wherein a bonding area of the bonding surface is determined to be smaller than a prescribed area when a magnitude of the reflection waveform detected by the waveform detection step is greater than a magnitude of the transmission waveform, and the bonding area of the bonding surface is determined to be equal to or larger than the prescribed area when the magnitude of the reflection waveform is equal to or smaller than the magnitude of the transmission waveform.

6. The wire bonding state determination device according to claim 5, wherein the bonding determination unit comprises a reference waveform database which stores, as a reference waveform, a reflection waveform from the bonding surface when the prescribed electric waveform is incident from the waveform detector to the wire in a good bonding state with the electrode, and with reference to the reference waveform database, defect bonding is determined when a magnitude of the reflection waveform detected by the waveform detector is greater than a magnitude of the reflection waveform included in the reference waveform, and good bonding is determined when the magnitude of the reflection waveform detected by the waveform detector is equal to or smaller than the magnitude of the reflection waveform included in the reference waveform.

* * * * *